United States Patent [19]

Kilby

[11] 3,781,866

[45] Dec. 25, 1973

[54] BINARY ENCODING SWITCH

[76] Inventor: Jack S. Kilby, 7723 Midbury, Dallas, Tex. 75230

[22] Filed: June 18, 1971

[21] Appl. No.: 154,494

[52] U.S. Cl. .............................. 340/347 P, 307/112
[51] Int. Cl. .............................................. G08c 9/08
[58] Field of Search ................................ 340/347 P; 235/61.11 A, 61.11 B, 61.12 C; 339/17 A, 17 B, 17 E; 307/112, 113, 115, 132 R, 133

[56] References Cited

UNITED STATES PATENTS

| | | | |
|---|---|---|---|
| 3,025,509 | 3/1962 | Petherick | 340/347 P |
| 2,880,410 | 3/1959 | Postman | 340/347 P |
| 3,487,460 | 12/1969 | Wheeler | 340/347 P |
| 3,379,835 | 4/1968 | Gilbert | 178/18 |

*Primary Examiner*—Maynard R. Wilbur
*Assistant Examiner*—Leo H. Boudreau
*Attorney*—Harold Levine and E. Mickey Hubbard

[57] ABSTRACT

A binary encoding switch is described having a slide which is manually movable along a linear path adjacent a printed circuit board. The printed circuit board has five tracks comprised of conductive and non-conductive segments and a sixth track that is continuously conductive. The slide houses six conductive balls, each of which is biased into engagement with one of the tracks by a separate conductive leaf spring. A guide way is associated with the printed circuit board for guiding the slide along the linear path. A set of detents is also associated with the printed circuit board and a detent pin is carried by the slide. The detent pin is manually disengaged by the same operating tab used to move the slide longitudinally of the track. Electrical energy is continuously provided to the balls by way of the continuously conductive track and the leaf springs. Thus, the balls and tracks form individual switches which are open or closed in accordance with the conductive and non-conductive segments of the tracks. A diode associated with each of the five segmented tracks permits the conductive state of the respective ball and track switch to be used for binary coding purposes.

8 Claims, 13 Drawing Figures

INVENTOR

JACK S. KILBY

INVENTOR
JACK S. KILBY

INVENTOR

JACK S. KILBY

BINARY ENCODING SWITCH

This invention relates generally to digital systems, and more particularly relates to an improved binary encoding switch.

There are many instances when it is desirable to convert the position of a mechanical member to a digital signal. Systems for producing binary coded signals representative of the rotational position of a shaft have heretofore been achieved. However, these devices are not suited for many applications because of inherent limitations of the number of positions which can be encoded and the fact that a rotary mechanical input is required.

This invention is concerned with an encoder that is compact and inexpensive, yet is capable of producing binarily coded logic signals representative of all alphanumeric characters. For example, the embodiment illustrated has five binary output lines which makes possible a total of 32 unique binary combinations, although only 27 are necessary for all alpha-numeric characters.

The encoding switch is particularly adapted to be arranged to provide a set of encoding switches which occupies a minimum frontal area, such as described in my co-pending application entitled "Teaching System," Ser. No. 154,493, filed on Dec. 30, 1971. The system utilizes a contact means which substantially prolongs the service life and provides very low friction operation. The switch includes compact detent means for accurately positioning the encoding switch at predetermined positions.

In accordance with the present invention, an encoding switch is provided having a plurality of tracks each having conductive and non-conductive segments. A conductive ball is provided for each track. Means are provided for moving each ball along the respective track while holding the ball in contact with the track and maintaining electrical contact with the ball. In the preferred form of the invention, the tracks are formed on a printed circuit board. An insulating plate is positioned adjacent the tracks and has openings for receiving a ball for each of the tracks. A conductive plate has spring fingers each of which engages one of the balls and biases the ball against the track while maintaining electrical contact with the ball. A series of detents is associated with the printed circuit board and a spring biased detent pin is carried by the means for moving the balls.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
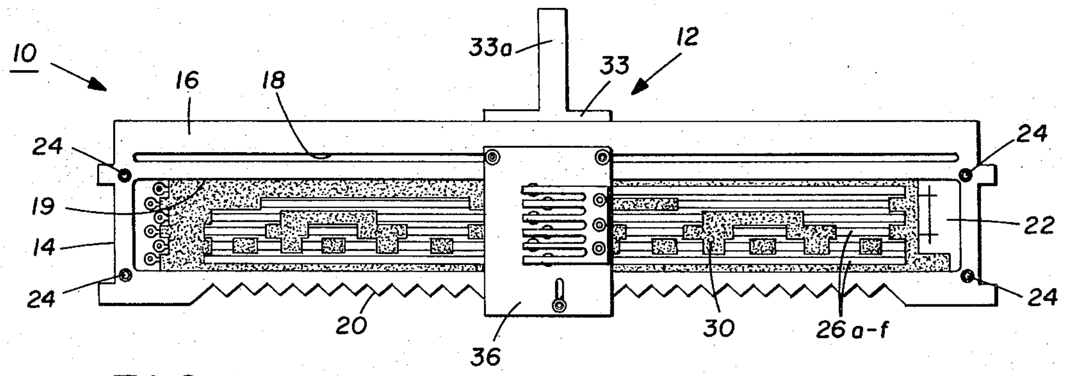
FIG. 1 is a side view of an encoding switch in accordance with the present invention.
Figure 2:
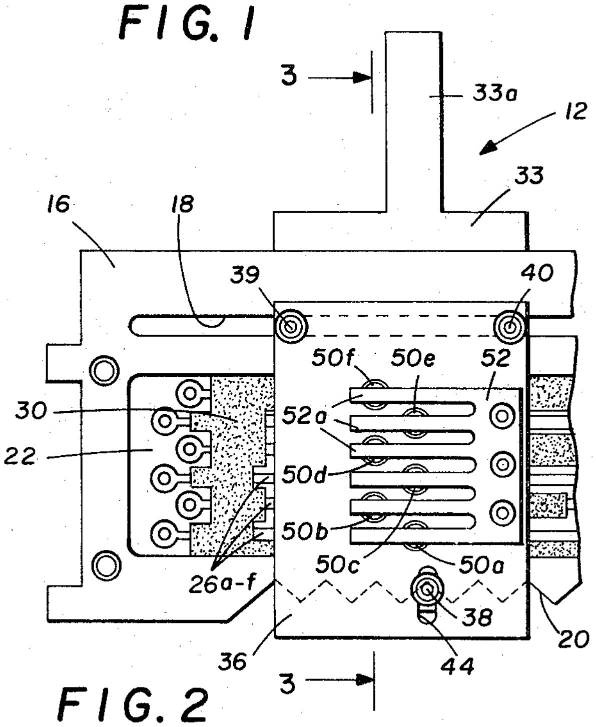
FIG. 2 is an enlarged view of the slide mechanism of the encoding switch of FIG. 1.
Figure 3:
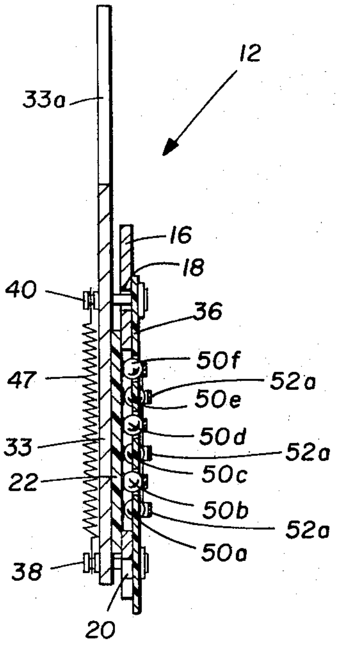
FIG. 3 is a sectional view taken substantially on lines 3—3 of FIG. 2.
Figure 4:
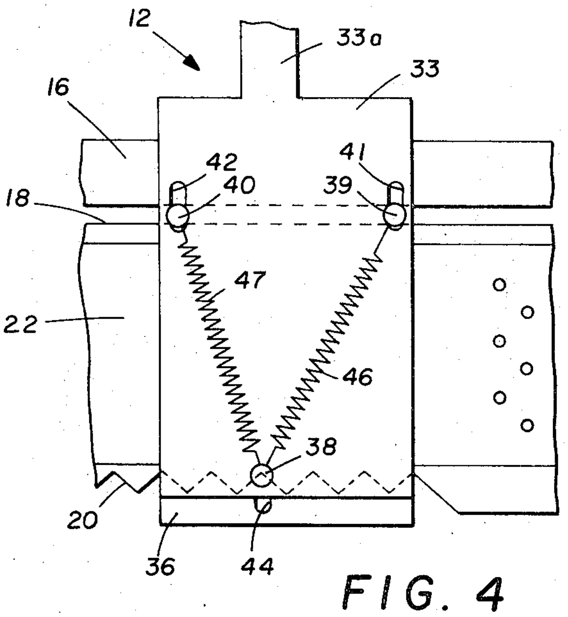
FIG. 4 is a view of the side of the slide mechanism opposite that shown in FIG. 2.
Figure 5:
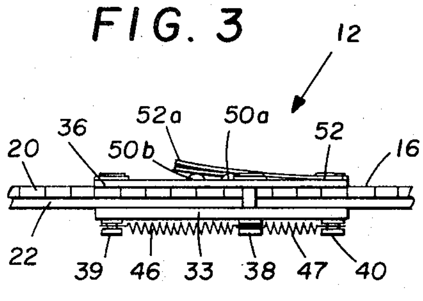
FIG. 5 is a bottom view of the slide mechanism shown in FIG. 2.
Figure 6:
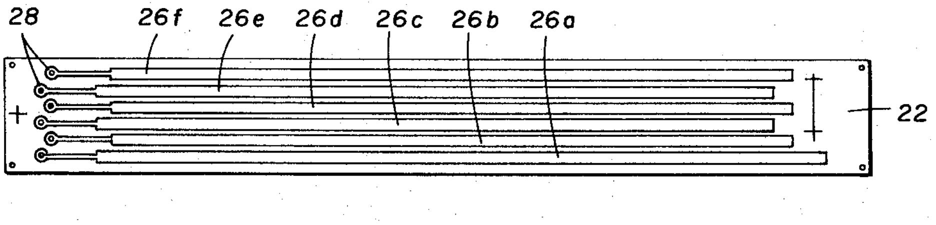
FIG. 6 is a side view of the printed circuit board of the encoding switch of FIG. 1.
Figures 9, 10, 11:
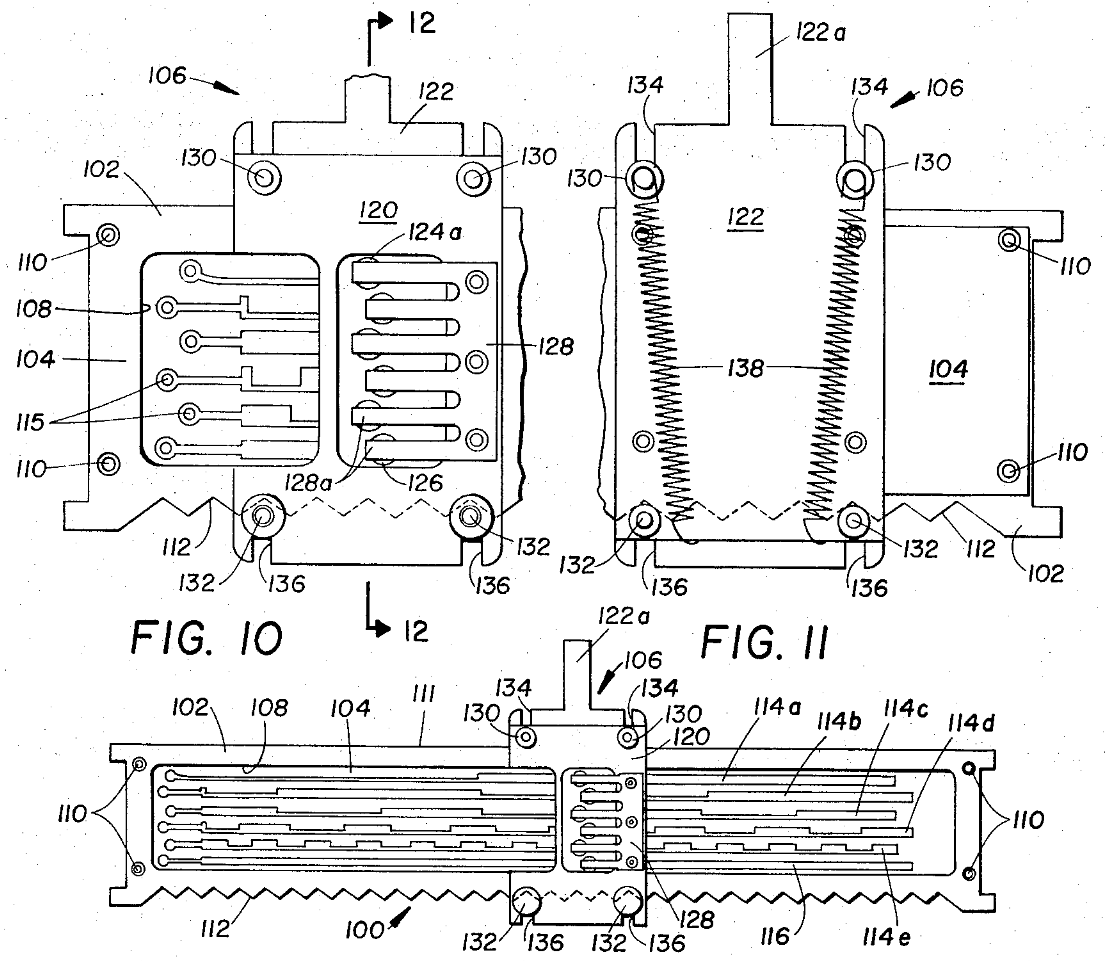
FIG. 9 is a side view of another encoding switch in accordance with the present invention.
FIG. 10 is an enlarged view of a portion of the encoding switch of FIG. 9.
FIG. 11 is a view of the opposite side of the portion of the encoding switch shown in FIG. 10.
Figure 12:
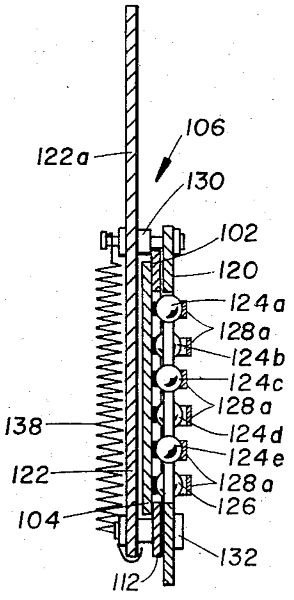
FIG. 12 is a sectional view taken substantially on lines 12—12 of FIG. 10.
Figure 13:
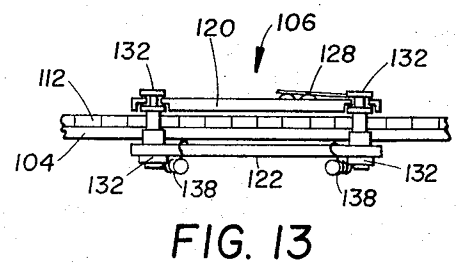
FIG. 13 is a bottom view of the slide of the encoding switch shown in FIG. 9.

Referring now to the drawings, an encoding switch in accordance with the present invention is indicated generally by the reference numeral 10 in FIG. 1. The encoding switch 10 comprises a slide unit, indicated generally by the reference numeral 12, a circuit board unit, indicated generally by the reference numeral 22, and a frame unit, indicated generally by the reference numeral 14. The frame unit 14 comprises a stamped sheet of metal 16 having a slot 18 extending along the top edge, saw tooth detents 20 extending along the bottom edge, and a window 21. A printed circuit board 22 is mounted in the window 21 by rivets 24. The metallic conductive pattern illustrated in FIG. 9 is formed on the circuit board 22 and comprises six metalized strips **26*a*–26*f* which extend parallel for substantially the length of the board 22. Each of the strips 26*b*–26*f* terminates at a solder connection aperture 28. An electrically insulating paint in the pattern shown in FIG. 6 is applied to the surface of the metallic strips 26*b*–26*f* and the printed circuit board 12. The paint is indicated by the stippled areas and is designated by the reference numeral 30. It will be noted that the lowermost metallic strip 26*a* is left exposed over its entire length. The remaining five metallic strips 26*b*–26*f* are coated in such a manner as to provide a unique combination of exposed and insulated conductors for each of 27 positions of the slide mechanism defined by the saw toothed detents 20**.

The slide mechanism 12 is comprised of a detent plate 33 disposed adjacent the frame 16 and an insulating contact support plate 36 disposed adjacent the printed circuit board 12. The plates 33 and 36 are interconnected at pins 38, 39 and 40. The upper pins 39 and 40 are fixed in the contact support plate 36 and extend through the horizontal slot 18 in the frame and through vertical slots 41 and 42, respectively, in the detent plate 33. The pin 38, on the other hand, is fixed in the detent plate 33 and extends through a vertical slot 44 in the contact support plate 36. Each of the pins 38, 39 and 40 have enlarged heads adjacent the slots 44, 41 and 42, respectively, to prevent separation of plates 33 and 36. The lower pin 38 is biased upwardly into the saw tooth detents 20 at the bottom edge of the frame 14 by springs 46 and 47 which interconnect pin 38 and pins 39 and 40, respectively. Thus, when detent plate 33 is pressed downwardly, by means of extension **33*a*, the plate moves downwardly to the limits of the slots 41, 42 and 44 so that the detent pin 38 will clear the saw tooth detents 20. The slide 12** may then be moved to the desired position representative of an alphabetic or numeric character.

The contact support plate 46 is provided with six openings, one being super-imposed over each of the conductive strips 26a–26f of the printed circuit 22. Six metallic balls 50a–50f are retained within these openings by a metal contact plate 52 which is connected to the support plate 36 by brads 54. The contact plate 52 has a spring-like finger 52a disposedadjacent each ball. Each finger 52a retains the respective ball 50 in the hole in the support plate 46 and also urges the ball against the respective metallic strip 26. As previously mentioned, the lower strip 26a is exposed over its entire length and provides a means for continuously energizing the contact plate 52 and hence all of the balls 50b–50f. Each of the other five balls 50b–50f then forms a switch which is closed when in contact with a conductive segment of the respective metallic strips 26b–26f, and which is open when in contact with the insulating paint over the respective strip.

Figure 8:
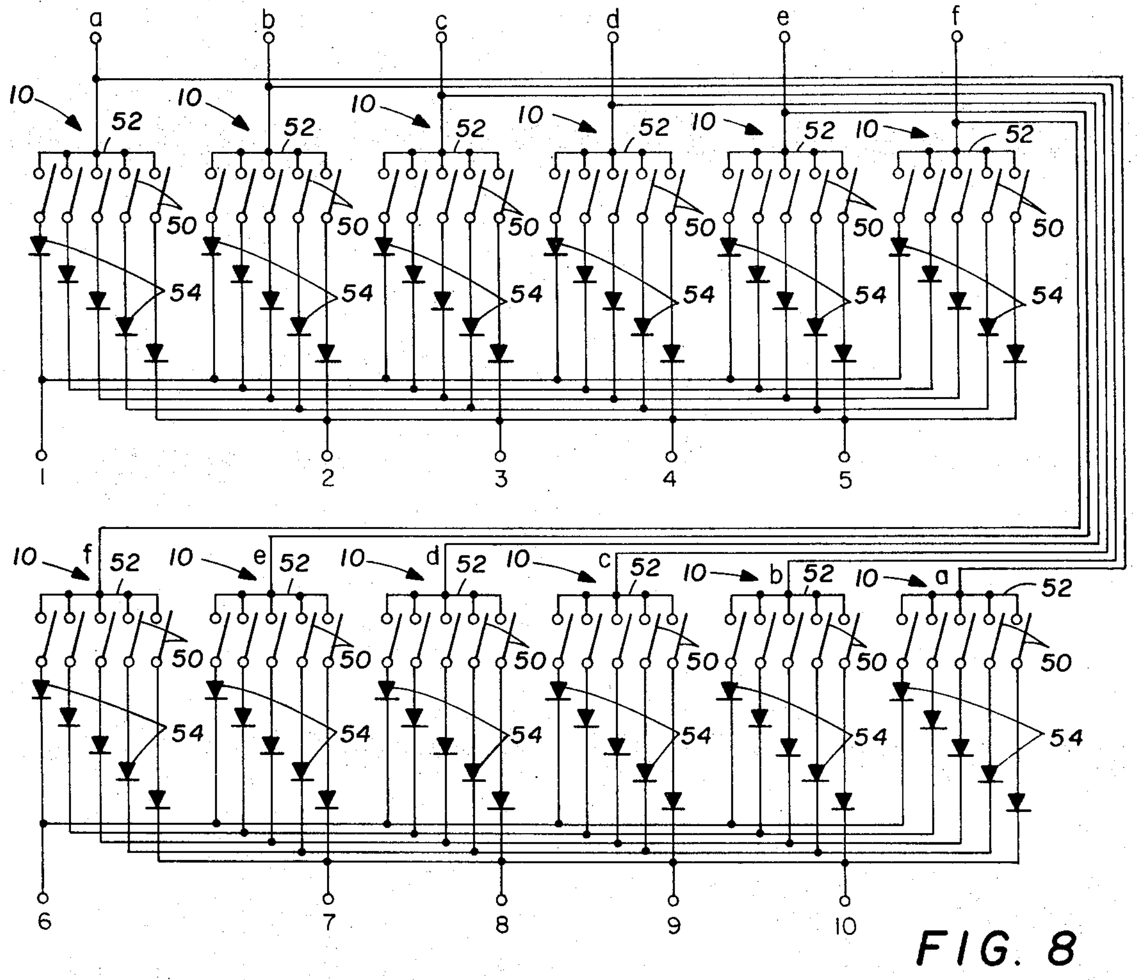
FIG. 8 is a schematic circuit diagram illustrating how the encoding switch of the unit of FIG. 1 may be electrically connected in a system.

FIG. 8 illustrates a circuit which utilizes 12 of the encoding switches 10, where corresponding parts are designated by corresponding reference characters. The strip 26a and the ball 50a complete the circuit to the plate 52, which is represented by the common buses designated by the reference character 52 in FIG. 8. The plates 52 of the 12 encoder switches 10 are addressed two-at-a-time by connecting a positive enabling voltage to one of the terminals a–f. Each of the individual switches 50 of each encoder switch 10 is then addressed through a diode 94 by connecting only one of the address lines 1–10 to ground. Thus, if the addressed ball 50b–50f is in contact with a conductive segment of the respective track, the addressed circuit will be completed and the completed circuit condition is representative of one logic level. If on the other hand, the addressed ball 50b–50f is in contact with a non-conductive segment, the address circuit will be open, and the open circuit condition is representative of the other logic level.

Another embodiment of the encoding switch of the present invention is indicated generally by the reference numeral 100 in FIG. 9. The encoding switch 100 is comprised of a frame portion 102, a printed circuit board 104 and a slide assembly indicated generally by the reference numeral 106.

The frame 102 may comprise a thin sheet of metal defining a window 108. The printed circuit board 104 is secured in the window 108 by rivets 110. The edge 111 of the frame is straight to provide a linear guide for the slide 106, and the opposite edge has a series of sawtooth detents 112.

Figure 7:
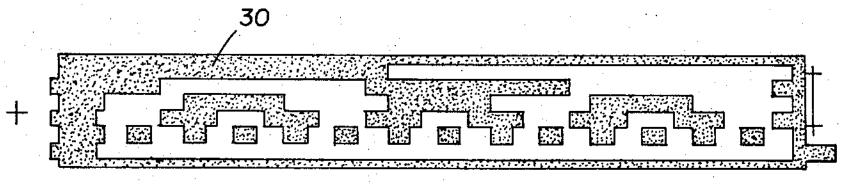
FIG. 7 is a side view of the insulation pattern placed on the printed circuit of FIG. 6 to provide the binary coded answer.

The printed circuit board 104 has five encoding tracks 114a–114e and a continuous power supply track 116, all of which are disposed in parallel relationship. Each of the tracks 114a–114e is a continuous conductive strip having alternate narrow and wide sections arranged so that the wide sections project from one edge, as best illustrated in FIG. 9. The wide sections form conductive segments and the narrow sections form non-conductive segments of an encoding track over which ball contacts roll as will presently be described. The narrow sections electrically interconnect the conductive sections and connect the sections to terminals 115. The printed circuit 104 thus functions in the same manner as the printed circuit 22 of the device 10, but is simpler to fabricate in that no insulated pattern such as illustrated in FIG. 7 is required to produce tracks having conductive and non-conductive segments.

The slide 106 has an insulating contact support plate 120 and a detent plate 122. The contact support plate 120 provides six openings which receive six conductive balls 124a–124e which roll along the tracks 114a–114e, respectively. The balls 124a–124e are positioned such as to contact the wide sections of the tracks 114a–114e but not the narrow sections, and thus may roll on either the conductive strips of the printed circuit or upon the non-conductive printed circuit board adjacent the narrow sections. A sixth ball 126 travels on the conductive strip 116. A contact plate 128 is riveted to support plate 120 and has six finger-like springs 128a which retain the balls 124a–124e and 126 in position within the openings in the insulating plate 120 and also urge the balls against the printed circuit board 104.

The contact support plate 120 and the detent plate 122 are interconnected by upper rivets 130 and lower rivets 132. The upper rivets 130 are fixed in the contact support plate 120 and are slidably received in open ended slots 134 in the top edge of the detent plate 122. An annular groove in the rivet 130 embraces the upper guide edge 112 of the frame 102. Enlarged flange portions formed on the rivets 130 embrace the opposite faces of the plate 122 adjacent the slots 134. The lower rivets 132 are fixed in the detent plate 122 and are slidably received in slots 136 in the lower edge of the contact plate 120. Flanges formed on the rivets 132 embrace the support plate 122 and the saw tooth detents 112. Tension springs 138 interconnect the upper rivets 130 and the lower edge of the detent plate 122 to bias the rivets 130 and 132 against the guide edge 111 and the detents 112.

The encoding switch 100 functions in the same manner as the encoding switch 10 to provide digitally encoded electrical signals, and thus may be substituted for the switch 10 and the circuit of FIG. 9. In operation, the switch 100 is located in an environment such that downward movement of the detent of plate 122 is limited at a point where the rivets 130 and 132 cannot leave the slots 134 and 136. When the detent plate 136 is pushed downwardly by pressure on the extension 122a, the springs 138 are extended and hold the upper pins down securely against the guide edge 111. At the same time, the lower pins 132 are moved downwardly out of engagement with saw tooth detents 122, so that the slide 106 may be moved along the tracks 114a–114e and 116. When the detent plate 122 is released, the springs 138 bias the detent plate 122 upwardly to move the lower pins 132 upwardly into the detents 112 and firmly position the balls 124a–124e at predetermined positions on the tracks 114a–114e.

From the above detailed description of a preferred embodiment of the invention, it will be appreciated that the encoding switch will have a long life because of the rolling contact between the balls 50a–50f and the respective tracks. The rolling contacts also provide low friction operation. The linear arrangement of the switch provides virtually unlimited encoding capability, yet the switch is relatively thin so that a set can be placed inside by side relationship. The detent system is provided which may be actuated simultaneously with movement of the slide. The slide and detent may be operated from one edge of the switch so that a plurality of levers may be positioned in relatively close proximity. The switches are relatively simple, reliable, and inexpensive to manufacture using well known and proven fabrication techniques. The switch utilizes no internal wiring which can become fouled during operation of the slide.

Although preferred embodiments of the invention have been described in detail, it is to be understood that various changes, substitutions and alterations can be made therein without departing from the spirit and scope of the invention as defined by the appended claims.

What is claimed is:

1. The encoding switch which comprises a stationary printed circuit board having a plurality of parallel tracks formed on one face thereof, at least two of the tracks having conductive and non-conductive segments, the conductive segments of each track being electrically common, the electrically common conductive segments of each track being electrically isolated from those of the other tracks, at least one of the tracks being conductive along its entire length, a carrier plate disposed adjacent the tracks and movable therealong having an aperture registering with each track, a conductive ball disposed in each aperture, a conductive plate connected to the carrier plate opposite the tracks having electrically common leaf springs engaging and biasing the balls into engagement with the respective tracks, said leaf springs providing electrical interconnection between all of the balls, and guide means for confining movement of the carrier plate to a path parallel to the tracks.

2. The encoding switch of claim 1 further characterized by detent means for selectively holding the carrier plate at preselected posiitons along the path.

3. The encoding switch of claim 2 wherein the guide means comprises means associated with the tracks, and the detent means comprises first detent means associated with the tracks and forming a series of detents, and second detent means associated with the contact means and movable transversely of the tracks into selective engagement with the detents.

4. The encoding switch of claim 3 wherein the second detent means is biased into the detents by spring means interconnecting the contact means and the second detent means.

5. The encoding switch of claim 4 wherein the second detent means is conformed to be manipulated to simultaneously disassociate the two detent means and move the contact means along said path.

6. The encoding switch of claim 1 wherein the tracks are formed by metallic strips of the printed circuit board.

7. The encoding switch of claim 6 wherein sections of the metallic strips are coated with an insulated material to form the non-conductive segments.

8. The encoding switch of claim 6 wherein the non-conductive segments are formed by the absence of conductive material on the printed circuit board.

* * * * *